United States Patent [19]

Idei

[11] 4,063,120

[45] Dec. 13, 1977

[54] CONSTANT VOLTAGE CIRCUIT

[75] Inventor: Gijun Idei, Yokohama, Japan

[73] Assignee: Tokyo Shibaura Electric Co., Ltd., Tokyo, Japan

[21] Appl. No.: 713,243

[22] Filed: Aug. 10, 1976

[30] Foreign Application Priority Data

Aug. 12, 1975 Japan .................................. 50-97985

[51] Int. Cl.[2] .............................................. H03K 17/00

[52] U.S. Cl. ..................................... 307/297; 307/254; 307/296 R; 323/4; 323/22 T

[58] Field of Search ............... 307/254, 255, 296, 297; 323/1, 4, 9, 22

[56] References Cited

U.S. PATENT DOCUMENTS

| | | | |
|---|---|---|---|
| 3,544,882 | 12/1970 | Tanaka | 323/4 |
| 3,617,859 | 3/1970 | Dobkin et al. | 323/4 |
| 3,886,435 | 5/1975 | Steckler | 307/297 |

*Primary Examiner*—Stanley D. Miller, Jr.
*Assistant Examiner*—B. P. Davis
*Attorney, Agent, or Firm*—Finnegan, Henderson, Farabow & Garrett

[57] ABSTRACT

A constant voltage circuit comprises first and second circuit terminals; a current source connected to said first and second circuit terminals; a first npn transistor whose collector is connected to the first circuit terminal through a resistor; a second npn transistor having a collector connected to the emitter of the first npn transistor, a base connected to the collector of the first npn transistor, and an emitter connected to the second circuit terminal; a third npn transistor having a base connected to the base of the first npn transistor, an emitter connected to the emitter of the first npn transistor through a resistor and a collector connected to the first circuit terminal through a resistor; a fourth transistor having a base connected to the collector of the third transistor and a collector and emitter coupled to the first and second circuit terminals; a resistor connected between the first circuit terminal and a junction of the bases of the first and third transistors; and a resistor connected between the second circuit terminal and a junction between the bases of the first and third transistors.

37 Claims, 11 Drawing Figures

FIG. 8
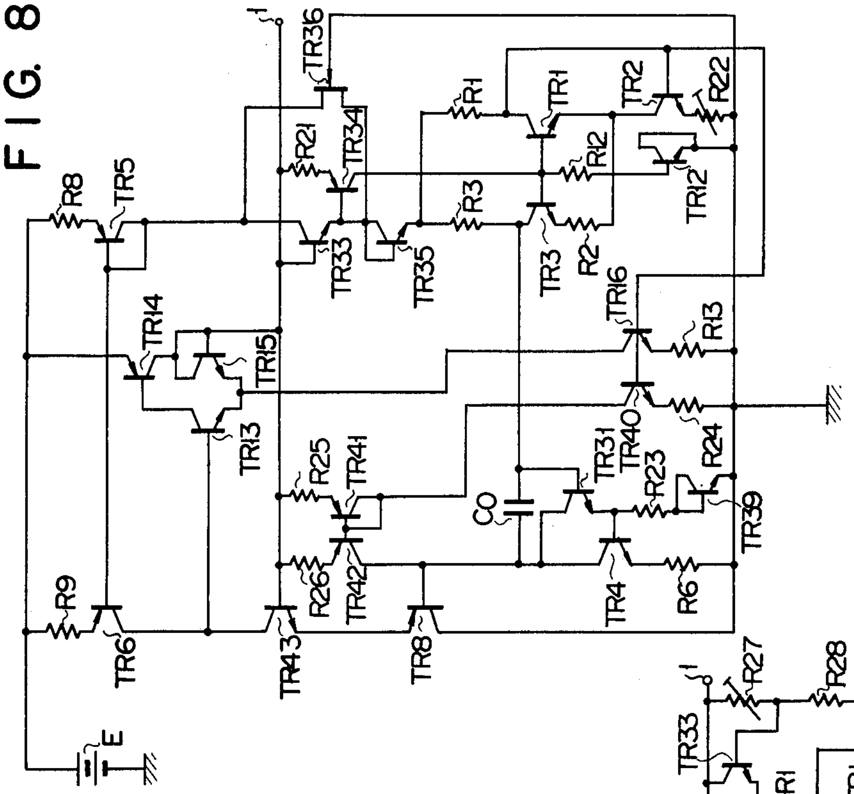
FIG. 7
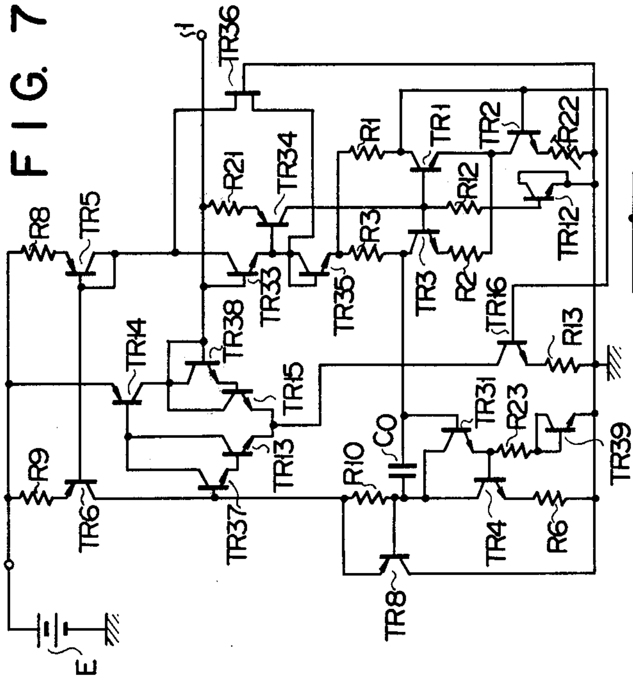
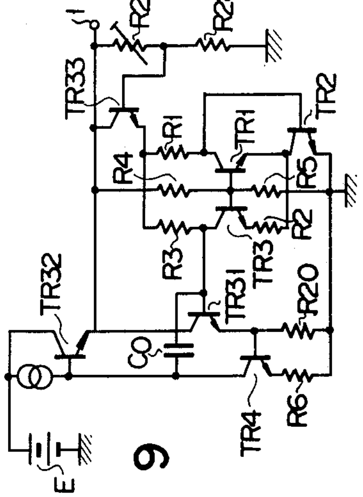
FIG. 9

CONSTANT VOLTAGE CIRCUIT

This invention relates to a constant voltage circuit for minimizing the voltage variation of a power supply due to a temperature variaiton.

An exposure meter using a light receiving element such as CdS etc. finds a wide application in a camera and a mercury cell is often used as a power supply for the exposure meter. The mercury cell can advantageously supply a stable voltage of about 1.3 volts, but it is liable to cause air pollution. For this reason it is desirable to use the other small type of cell. For example, a manganese cell can be used for this object. Since, however, the output voltage of the manganese cell is greatly varied, the manganese cell is proved unsatisfactory as a power supply for an exposure meter requiring a high precision.

It is accordingly the object of this invention to provide a constant voltage circuit capable of supplying a low stable output voltage.

According to one embodiment of this invention there is provided a constant voltage circuit comprising first and second circuit terminals; a first transistor of one conductivity type having a collector coupled to said first circuit terminal; a second transistor of said one conductivity type having a collector and base respectively connected to the emitter and collectors of said first transistor and an emitter connected to said second circuit terminals; a third transistor of said one conductivity type having a base and emitter respectively coupled to the base and emitter of said first transistor and a collector coupled to said first circuit terminal; a fourth transistor of said one conductivity type having a base coupled to the collector of said third transistor and a collector and emitter respectively coupled to said first and second circuit terminals; and bias means for applying a base voltage to the bases of said first and third transistors.

This invention will be further described by way of example by referring to the accompanying drawings in which:

FIG. 7 shows a constant voltage circuit according to another embodiment of this invention, the circuit providing a small power dissipation and a small input-output voltage difference;

FIG. 8 shows a constant voltage circuit, an improved version of the circuit in FIG. 7, for suppressing an output voltage variation; and FIGS. 9 to 11, respectively, show modified forms of the embodiments in FIGS. 6 to 8.

Figure 1:
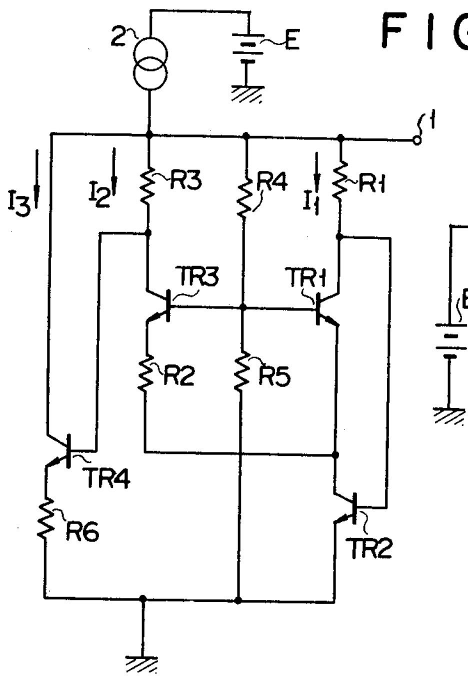
FIG. 1 shows a constant voltage circuit according to one embodiment of this invention.

FIG. 1 shows a constant voltage circuit having four pnp transistors $TR_1$, $TR_2$, $TR_3$ and $TR_4$. The transistor $TR_1$ has a collector connected through a resistor $R_1$ to an output terminal 1. A current source 2 is connected to output terminal 1 and adapted to be driven by a power supply E and supplies a current. The emitter of the transistor $TR_1$ is connected to the collector of the transistor $TR_2$, and the transistor $TR_2$ has a grounded emitter and a base connected to the collector of the transistor $TR_1$. The base of the transistor $TR_1$ is connected to a base of the transistor $TR_3$. The transistor $TR_3$ has an emitter connected through a resistor $R_2$ to the emitter of the transistor $TR_1$ and a collector connected through a resistor $R_3$ to the output terminal 1. A resistor $R_4$ is connected between output terminal 1 and a junction of the base of the transistors $TR_1$ and $TR_3$, and a resistor $R_5$ is connected between ground and the junction of the bases of the transistors $TR_1$ and $TR_3$, the resistors $R_4$ and $R_5$ providing a bias circuit for applying a bias voltage to the bases of the transistors $TR_1$ and $TR_3$. The transistor $TR_4$ has a base connected to the collector of the transistor $TR_3$, a collector connected to the output terminal 1 and an emitter connected through a resistor $R_6$ to ground.

The operation of the constant voltage circuit in FIG. 1 will now be explained below.

During the operation, electric current flows through the collector of the transistor $TR_1$ by way of the resistor $R_1$ and a collector voltage of the transistor $TR_1$ is applied to the base of the transistor $TR_2$. If transistors having a sufficiently large current amplification factor are used as the transistors $TR_1$ and $TR_2$, the collector voltage of the transistor $TR_1$ is determined by the base emitter path of the transistor $TR_2$. With $I_1$ representing a current flowing through the collector-emitter path of the transistor $TR_1$, and $V_0$ a voltage on the output terminal 1, the current $I_1$ will be given by $$I_1 = (V_0 - V_{BE2})/R_1 \qquad (1)$$

The base-emitter voltage $V_{BE1}$ of the transistor $TR_1$ is automatically adjusted to a value large enough to permit a flow of the current $I_1$. Since the bases of the transistors $TR_1$ and $TR_3$ are connected to each other and the emitter of the transistor $TR_3$ is connected through the resistor $R_2$ to the emitter of the transistor $TR_1$, an emitter current $I_2$ flowing through the transistor $TR_3$ becomes smaller than the emitter current $I_1$ flowing through the transistor $TR_1$ and in consequence a voltage increasing with a rise in temperature is developed across the resistor $R_2$. The resistor $R_3$ is connected to the collector of the transistor $TR_3$, and a voltage having a value obtained by multiplication of a voltage across the resistor $R_2$ by a ratio $R_3/R_2$ of the resistance of the resistor $R_3$ to the resistance of the resistor $R_2$ is generated across the resistor $R_3$. As a result, a voltage across the resistor $R_3$ is increased with a rise in temperature. On the other hand, a voltage decreasing with a rise in temperature is developed across the base-emitter path of the transistor $TR_4$. The values of the resistors $R_2$ and $R_3$, if properly selected, permit compensation of voltage changes caused by the temperature variation in the base-emitter voltage of the transistor $TR_4$ and the voltage across the resistor $R_3$, making it possible to maintain the voltage $V_0$ constant. Suppose that a voltage $V_0$ on the output terminal has increased for some reason or other. Then, the collector voltage of the transistor $TR_3$ is increased and in consequence the collector current of the transistor $TR_4$ is increased. Since, however, electric current from the current source 2 is virtually constant, the voltage on the output terminal is decreased. As a result, the voltage $V_0$ on the output terminal is maintained substantially constant.

Suppose now that in the constant voltage circuit shown in FIG. 1 transistors having a sufficiently great current amplification factor are used as transistors $TR_1$, $TR_2$ and $TR_3$. With $I_1$, $I_2$ and $I_3$ representing currents flowing through the collector-emitter paths of the transistors $TR_1$, $TR_3$ and $TR_4$, respectively, and $V_{c3}$ a collector voltage of the transistor $TR_3$, the following equations are established:

$$I_1 = \frac{V_0 - V_{BE2}}{R_1} = \alpha T^n \exp\left[\frac{q}{KT}(V_{BE1} - V_{g0})\right] \tag{2}$$

$$l_n\frac{I_1}{I_2} = l_n\left(\frac{V_0 - V_{BE2}}{V_0 - V_{03}} \cdot \frac{R_1}{R_3}\right) = \frac{q}{KT} \cdot \frac{V_0 - V_{c3}}{R_3} \cdot R_2 \tag{3}$$

$$V_{BE2} - V_{BE1} = \frac{KT}{q} \cdot l_n\left(1 + \frac{I_2}{I_1}\right) \tag{4}$$

$$I_3 = \alpha T^n \exp\left[\frac{q}{KT}(V_{c3} - I_3R_6 - V_{g0})\right] \tag{5}$$

where $q$ : electron charges $K$ : Bolzmann's constant ($K/q = 8.66 \times 10^{-5}\ V/°K$)

$\alpha$ : constant $n$ : constant as determined by a transistor manufacturing method (for example, $n = 1.5$ for a double diffusion silicon transistor)

$V_{g0}$: voltage corresponding to the band gap energy of a semiconductor substrate used (for example, $V_{g0} = 1.218V$ for silicon)

T : absolute temperature

Differentiating the equation (2) by the absolute temperature T and rearranging it yields $$\frac{-1}{V_0 - V_{BE2}} \cdot \frac{dV_{BE2}}{dT} = \frac{n}{T} - \frac{q}{KT^2}(V_{BE1} - V_{g0}) + \frac{q}{KT} \cdot \frac{dV_{BE1}}{dT} \tag{6}$$

Differentiating both the terms of the equation (4) by the absolute temperature T gives $$\frac{dV_{BE1}}{dT} = \frac{dV_{BE2}}{dT} - \frac{k}{q} l_n\left(1 + \frac{I_2}{I_1}\right) \tag{7}$$

Substituting the equation (7) in the equation (6) and rearranging it gives $$\frac{dV_{BE2}}{dT} = -\frac{n + \frac{q}{KT}(V_{g0} - V_{BE1}) - l_n\left(1 + \frac{I_2}{I_1}\right)}{1 + \frac{q}{KT}(V_0 - V_{BE2})} \cdot \frac{V_0 - V_{BE2}}{T} \tag{8}$$

Differentiating the equation (3) by the absolute temperature T and rearranging it gives $$\frac{dV_{c3}}{dT} = \frac{\frac{1}{V_0 - V_{BE2}} \cdot \frac{dV_{BE2}}{dT} - \frac{q}{KT} \cdot \frac{R_2}{R_3} \cdot \frac{V_0 - V_{c3}}{T}}{\frac{q}{KT} \cdot \frac{R_2}{R_3} + \frac{1}{V_0 - V_{c3}}} \tag{9}$$

by sybstituting the equation (8) into the equation (9), $$\frac{dV_{c3}}{dT} = -\frac{V_0 - V_{c3}}{T} \cdot \left[1 + \frac{\frac{n + \frac{q}{KT}(V_{g0} - V_{BE1}) - l_n\left(1 + \frac{I_2}{I_1}\right)}{1 + \frac{q}{KT}(V_0 - V_{BE2})}}{1 + \frac{R_2}{R_3} \cdot \frac{q}{KT}(V_0 - V_{c3})}\right] \tag{10}$$

By differentiating the equation (5) by the absolute temperature, $$\frac{1}{I_3} \cdot \frac{dI_3}{dT} = \frac{n}{T} - \frac{q}{KT^2}(V_{c3} - I_3R_6 - V_{g0}) + \frac{q}{KT} \cdot \frac{dV_{c3}}{dT} \tag{11}$$

By substituting in the equation (11) a conditional equation $$\frac{dI_3}{dT} = 0 \tag{12}$$

under which the voltage $V_0$ on the output terminal 1 is not varied due to a temperature variation, $$\frac{dV_{c3}}{dT} = \frac{V_{c3} - I_3R_6 - V_{g0}}{T} - n \cdot \frac{k}{q} \tag{13}$$

since $I_3 \neq 0$.

If, as derived from the equation (12), $I_3R_6$ is a value independent of the absolute temperature, that is, if the equations (10) and (13) are equal to each other with a sufficiently great gain of the transistor $TR_4$, a temperature compensation in the constant voltage circuit is satisfactorily made. An output voltage $V_0$ substantially unaffected by the temperature variation is found from the following equation:

$$V_0 = V_{g0} + I_3R_6 + n(KT/q) - (V_0 - V_{c3}) \cdot \frac{\frac{n + \frac{q}{KT}(V_{g0} - V_{BE2}) - l_n\left(1 + \frac{I_2}{I_1}\right)}{1 + \frac{q}{KT}(V_0 - V_{BE2})} - 1}{1 + \frac{R_2}{R_3} \cdot \frac{q}{KT}(V_0 - V_{c3})} \tag{14}$$

With $V_{g0} = 1.218V$, $I_3R_6 = 0.060V$, $T = 298°\ K$, $n = 1.5$, $V_{c3} = 0.730V$, $V_{BE2} = 0.720V$, $R_2R_3 = 0.1$ and $I_2/I_1 = 0.1$, then $$V_0 \simeq 1.31V$$

In this case, if the fourth term on the right side of the equation (14) is small enough to be negligible and $$V_0 = V_{g0} + I_3R_6 + n(KT/q) \tag{15}$$

the output voltage $V_0$ is obtained which is not varied due to the temperature variation. That is, when the amplification operation of transistors which are connected in the succeeding stage is taken into consideration, it will be found that, in order to effect temperature compensation of the constant voltage circuit, the constant voltage circuit should be designed so that $I_3$ in the equation (11) may vary in proportion to the absolute temperature. In other words, it is necessary that the following equation be satisfied.

$$\frac{dI_3}{dT} - \frac{I_3}{T} = 0 \quad (16)$$

Substituting the equation (16) into the equation (11) yields $$\frac{dV_{c3}}{dT} = \frac{1}{T}(V_{c3} - I_3R_6 - V_{g0}) - V_{g0}(n-1)\frac{k}{q} \quad (17)$$

The output voltage $V_0$ is found, like the equation (15), from the equation (17), $$V_0 \simeq V_{g0} + I_3R_6 + (n-1)\cdot\frac{KT}{q} \quad (18)$$

If each value of the resistors $R_1$ and $R_6$ is so properly set as to fulfill the equation (15) in a case where the transistor $TR_4$ has a high amplification factor and the equation (18) in a case where the transistor $TR_4$ has a low amplification factor, a constant voltage circuit with low voltage can be obtained which is unaffected by the temperature variation. It is to be noted that the resistor $R_6$ can have a value of zero.

Figure 2:
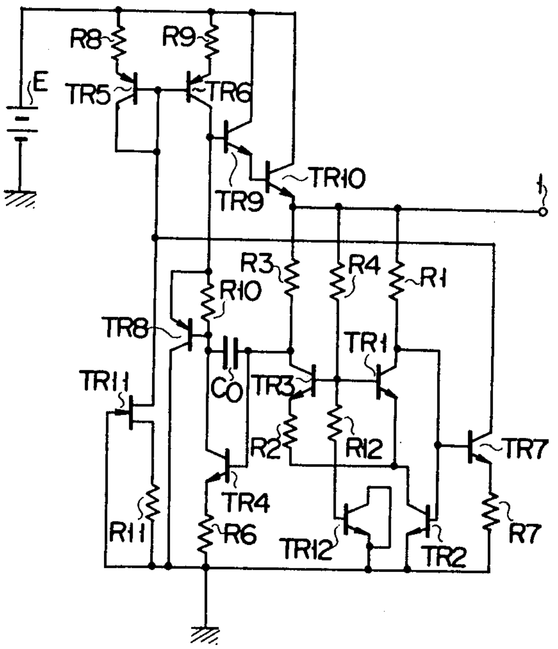
FIG. 2 shows an improved constant voltage circuit for providing a more stable output voltage with respect to a temperature variation.

FIG. 2 is a constant voltage circuit according to another embodiment of this invention, in which the amplification degree of the transistor $TR_4$ is enhanced. In this Figure, like reference numerals are employed to designate elements corresponding to those shown in FIG. 1 and further explanation will be therefore omitted.

The collector of the transistor $TR_4$ is connected to the base of a transistor $TR_8$ and through a resistor $R_{10}$ to a constant current souce comprising pnp transistors $TR_5$ and $TR_6$, npn transistor $TR_7$ and resistors $R_7$, $R_8$ and $R_9$. The base of the transistor $TR_6$ is connected to the base of the transistor $TR_5$, the base of the latter transistor being connected to its own collector. The emitters of the transistors $TR_5$ and $TR_6$ are connected respectively through the resistors $R_8$ and $R_9$ to the positive terminal of a power supply E. The transistor $TR_7$ has a base connected to the base of the transistor $TR_2$, a collector connected to the base of the transistor $TR_5$ and an emitter connected to ground through the resistor $R_7$. The emitter of the transistor $TR_8$ and collector of the transistor $TR_6$ are connected to the base of a first stage transistor $TR_9$ which constitutes a Darlington circuit together with a transistor $TR_{10}$. The emitter of the succeeding stage transistor $TR_{10}$ in the Darlington circuit is connected to an output terminal, and the collectors of the transistors $TR_9$ and $TR_{10}$ are connected to the positive terminal of the power supply E.

During the operation of the constant voltage circuit a given electric current flows through the collector of the transistor $TR_7$ to cause a bias to be applied to the base of the transistor $TR_6$ and a constant current is supplied to the collectors of the transistors $TR_4$ and $TR_8$ through the emitter-collector path of the transistor $TR_6$. That is, a circuit including the transistors $TR_4$ and $TR_8$ is equivalently coupled to a very high load resistance and the input impedance of the Darlington circuit is very high. In consequence, a very high voltage amplification can be obtained and the variation of the output voltage $V_0$ is restricted to a minimum as in the case of the constant voltage circuit in FIG. 1. A capacitor $C_0$ is a capacitor for preventing oscillation and it is connected between the collector and the base of the transistor $TR_4$ so as to make the operation of the constant voltage circuit stable. A starting circuit, comprising a transistor $TR_{11}$ and a resistor 11, makes it easy to start the constant voltage circuit. In the absence of the starting circuit an output voltage on the output terminal 1 is not increased even when the power supply is turned ON. That is, since no electric current flows through the transistor $TR_7$ before the turning ON of the power supply, even when the power supply is turned ON, no electric current flows through the transistor $TR_6$ and in consequence the output on the voltage is maintained to be zero. The starting circuit permits electric current to flow through the resistor $R_{11}$ by way of the transistor $TR_{11}$ during the turning ON of the power supply. Since a bias voltage is applied through the resistor $R_{11}$ to the base of the transistor $TR_6$, the constant voltage circuit is immediately started. The starting circuit may be constructed of a resistor circuit and in this case the output voltage is greatly varied. If in this case the collector current of the transistor $TR_7$ is made great and electric current flowing through the starting circuit or the substitute resistor circuit is set to be a lowest possible value necessary to turn the transistor $TR_{11}$ ON, the output voltage variation can be restricted to minimum. In this embodiment, a resistor $R_{12}$ and diode-connected npn transistor $TR_{12}$ are employed in place of the resistor $R_5$ in the constant voltage circuit in FIG. 1. The transistor $TR_{12}$ has an emitter and collector connected to ground and a base connected to the resistor $R_{12}$. Since the base emitter voltage of the transistor $TR_{12}$ is decreased with a rise in temperature, a direction in which the base-biased voltage of transistors $TR_1$ and $TR_3$ is varied due to the temperature variation is the same as a direction in which the base-emitter voltage of the transistor $TR_{12}$ is varied due to the temperature direction. As a result, a stable operation is assured over a wide temperature variation range.

In the constant voltage circuit in FIG. 2 the output voltage is about 1.6 volts lower than the input voltage due to the presence of the transistor $TR_6$ and the darlington circuit comprising the transistors $TR_9$ and $TR_{10}$. In consequence, if an output voltage of, for example, 1.3*V* is to be obtained, an input voltage of 2.9 volts is required with the resultant poor efficiency.

Figure 3:
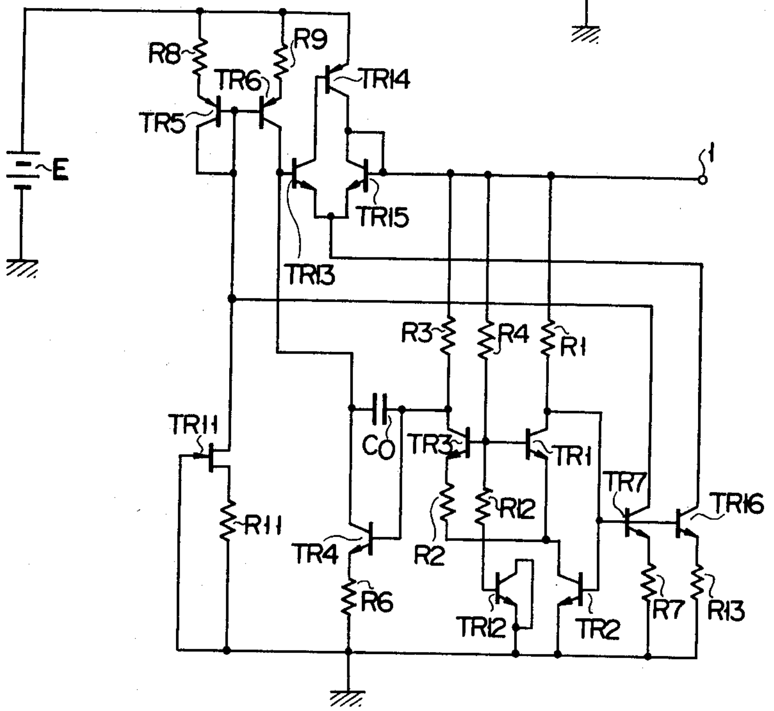
FIG. 3 shows a constant voltage circuit, an improved version of the circuit in FIG. 2, for providing a small input-output voltage difference.

A constant voltage circuit in FIG. 3 is designed to overcome such defects. In FIG. 3 an npn transistor $TR_{13}$ having a base connected to a junction between the collectors of transistors $TR_4$ and $TR_6$. The collector of the transistor $TR_{13}$ is connected to the base of a pnp transistor $TR_{14}$ whose emitter is connected to the power supply E. The collector of the transistor $TR_{14}$ is connected to an npn transistor $TR_{15}$ having a collector connected to its base and to the output terminal 1. The emitters of the transistors $TR_{15}$ and $TR_{13}$ are connected to each other and to a constant current source comprising an npn transistor $TR_{16}$ and resistor $R_{13}$. The transistor $TR_{16}$ has a collector connected to a junction between the emitters of the transistors $TR_{13}$ and $TR_{15}$, a base connected to collector of the transistor $TR_1$ and an emitter connected through a resistor $R_{13}$ to ground.

In the constant voltage circuit shown in FIG. 3 the output signal of the transistor $TR_4$ is amplified by the transistors $TR_{13}$ and $TR_{14}$ and it is 100% negatively fed by the transistor $TR_{15}$ back to the emitter of the transistor $TR_{13}$. In consequence, the input signal to the base of the transistor $TR_{13}$ and the output signal are in phase with and substantially equal in magnitude to each other.

The transistors $TR_{13}$, $TR_{14}$ and $TR_{15}$ constitute a voltage follower circuit having a small input-output voltage difference. Since the transistor $TR_{14}$ is operated even in such a state that the collector-emitter voltage is lowered sufficiently to about a saturation voltage, a voltage between the positive terminal E and the output terminal 1 can be restricted to about 0.3*V*. If, therefore, an output voltage of, for example, 1.3*V* is to be obtained, an input voltage of about 1.6*V* may be used. When, for example, an M*n* dry battery is used as a power supply, even if the power supply voltage is dropped to 1.6*V*, a constant voltage of 1.3*V* is obtained as an output voltage, providing a prominent improvement from the standpoint of economy. The same result is also obtained if a diode is used in place of the transistor $TR_{15}$ or if the collector of the transistor $TR_{15}$ is connected to the power supply E.

Figure 4:
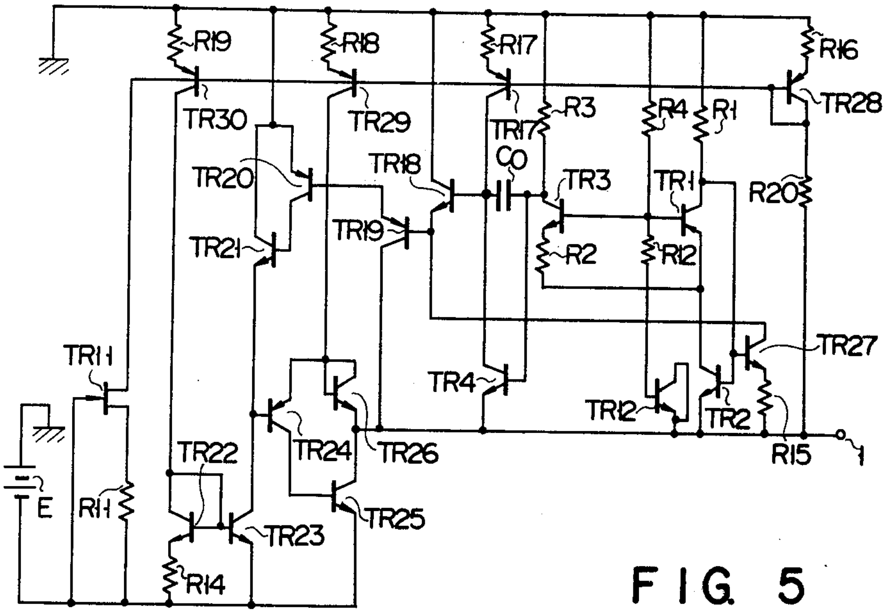
FIG. 4 shows a constant voltage circuit according to another embodiment of this invention in which a negative voltage is supplied.

FIG. 4 shows a constant voltage circuit according to another embodiment of this invention, in which a power supply voltage for supplying a negative voltage may have a wide range. In this embodiment, like reference numerals are employed to designate elements corresponding to those shown in FIG. 3 and further explanation is therefore omitted.

The collector of the transistor $TR_4$ is connected to the collector of a transistor $TR_{17}$ which constitutes one element of a constant current source. The collector voltage of the transistor $TR_4$ is fed, through an emitter follower circuit comprising an npn transistor $TR_{18}$ and pnp transistor $TR_{19}$, to that amplification circuit, comprising a pnp transistor $TR_{20}$ and npn transistor $TR_{21}$, where it is reversed in its phase and amplified. The transistor $TR_{18}$ has a base connected to the collectors of the transistors $TR_4$ and $TR_{17}$, a collector connected to ground and an emitter connected to the base of the transistor $TR_{19}$. The emitter of the transistor $TR_{19}$ is connected to the base of the transistor $TR_{20}$ whose emitter is connected to ground. The collector of the transistor 20 is connected to the base of the transistor $TR_{21}$ whose collector is connected to ground.

A resistor $R_{14}$ and npn transistor $TR_{22}$ and $TR_{23}$ constitute a constant current source. A pnp transistor $TR_{24}$ and npn transistors $TR_{25}$ and $TR_{26}$ perform the same operation as the transistors $TR_{13}$, $TR_{14}$ and $TR_{15}$ in FIG. 3 and constitute a voltage follower circuit having a small input-output voltage difference. That is, the transistor $TR_{22}$ has a base connected to its own collector and an emitter connected through the resistor $R_{14}$ to the negative terminal of the power supply E and the transistor $TR_{23}$ has an emitter connected to the negative terminal of the power supply E, a base connected to the base of the transistor $TR_{22}$ and a collector connected to the base of the transistor $TR_{24}$ and to the emitter of the transistor $TR_{21}$. The transistor $TR_{24}$ has a collector connected to the base of the transistor $TR_{25}$ and an emitter connected to the collector of the transistor $TR_{26}$, and the transistor $TR_{25}$ has an emitter connected to the negative terminal of the power supply E and a collector connected to the emitter of the transistor $TR_{26}$, collector of the transistor $TR_{19}$ and output terminal 1. The transistor $TR_{26}$ has a base connected to its own collector.

An npn transistor $TR_{27}$ and resistor 15 constitutes a constant current source for supplying a constant electric current to the transistor $TR_{18}$. The transistor $TR_{27}$ has an emitter connected through the resistor 15 to the output terminal 1, a base connected to the base of a transistor $TR_2$ and a collector connected to the emitter of the transistor $TR_{18}$.

pnp transistors $TR_{28}$, $TR_{17}$, $TR_{29}$ and $TR_{30}$ are connected respectively to resistors $R_{16}$, $R_{17}$, $R_{18}$ and $R_{19}$, constituting constant current sources. The emitters of the transistors $TR_{28}$, $TR_{17}$, $TR_{29}$ and $TR_{30}$ are connected respectively through resistors $R_{16}$, $R_{17}$, $R_{18}$ and $R_{19}$ to ground, and the bases of the transistors $TR_{28}$, $TR_{17}$, $TR_{29}$ and $TR_{30}$ are connected to the drain of a field effect transistor $TR_{11}$. The transistor $TR_{28}$ has a collector connected to its own base and to the output terminal 1 through a resistor $R_{20}$, the transistor $TR_{29}$ has a collector connected to the emitter of the transistor $TR_{24}$, and the transistor $TR_{30}$ has a collector connected to the collector of the transistor $TR_{22}$.

The emitter follower circuit constituted by the npn transistor $TR_{18}$ and pnp transistor $TR_{19}$ is so incorporated into the constant voltage circuit that by increasing the input impedance of the emitter follower circuit the amplification factor of the transistor $TR_4$ is made great so as to restrict the output voltage variation of the constant voltage circuit to a minimum and that even if a capacitor $C_0$ has a small value a sufficient oscillation preventing effect is obtained. With the capacitor $C_0$ incorporated into the constant voltage circuit an amplification $G_V$ is given, as well known in the art, by $$G_V = \frac{-A}{1 + j\omega C_0 (1 + A) R_s} \qquad (17)$$

where $R_s$ denotes a signal source impedance $R_s$ as viewed toward the signal source from the base of the transistor $TR_4$ and A denotes a voltage amplification factor before the capacitor is incorporated into the circuit comprising the transistor $TR_4$.

As will be evident from the equation (17) the capacitor $C_0$ is equivalent to a capacitor having (1+A) times its capacitance. As a result, a sufficiently low cut-off frequency and oscillation preventing effect are obtained. In this embodiment a sufficient oscillation preventing effect is obtained using a capacitor of, for example 20pF. The 20pF capacitor can be easily incorporated into an integrated voltage circuit.

For a −1.5V input voltage, a −1.3V output voltage unaffected by the temperature change is obtained in the constant voltage circuit shown in FIG. 4.

Although in the above-mentioned embodiment explanation is directed to the obtainment of a stable ±1.3V output voltage with a ±1.5V power supply as an input voltage, it is possible to obtain an output voltage having an integral multiple of ±1.3V.

Figure 5:
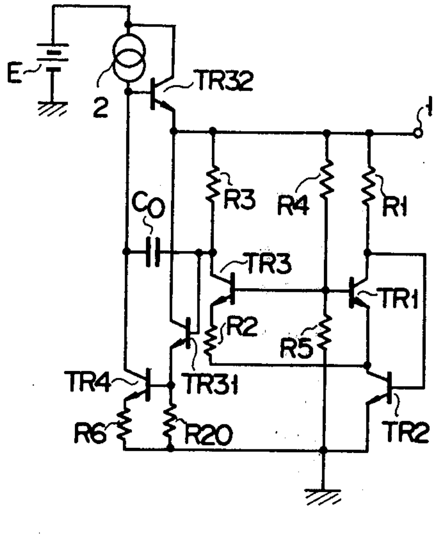
FIGS. 5 and 6 show constant voltage circuit adapted to respectively supply output voltages two and three times the output voltage of the constant voltage circuit in FIG. 1.

FIG. 5 shows a constant voltage circuit as obtained by adding npn transistors $TR_{31}$ and $TR_{32}$, resistor $R_{20}$ and capacitor $C_0$ to the constant voltage circuit shown in FIG. 1. In this Figure, like reference numerals are employed to designate elements corresponding to those shown in FIG. 1 and further explanation is therefore omitted.

The transistor $TR_{31}$ has an emitter connected to the base of the transistor $TR_4$ and to ground through the resistor $R_{20}$ and a base connected to the collector of the transistor $TR_3$. The capacitor $C_0$ is connected to the collectors of the transistors $TR_3$ and $TR_4$ and the transistor $TR_{32}$ has a collector connected to the positive terminal of a power supply E, a base connected to the collector of the transistor $TR_4$ and an emitter connected to the output terminal 1 and to the collector of the transistor $TR_{31}$.

In this embodiment the emitter-base voltage of the transistors $TR_4$ and $TR_{31}$ is decreased with a rise in temperature. The decreased emitter-base voltage of the transistors $TR_4$ and $TR_{31}$ is compensated by a voltage across the resistor $R_3$ which is increased by the temperature increase. The constant voltage circuit provides a 2.6V stable output voltage corresponding to two times the output voltage of the constant voltage circuit in FIG. 1.

Figure 6:
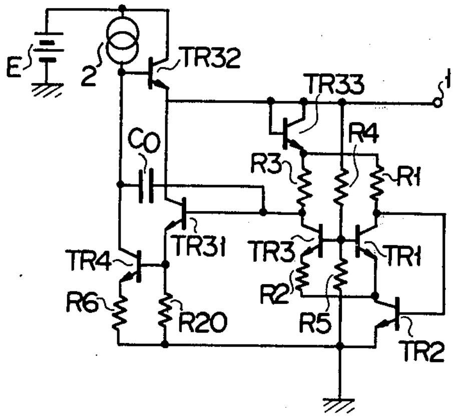

FIG. 6 shows another embodiment of this invention. This embodiment is the same as the embodiment in FIG. 5 except that an npn transistor $TR_{33}$ has an emitter connected to the resistor $R_3$ and a collector and base connected to the output terminal 1. Since the base-emitter paths of the transistors $TR_4$, $TR_{31}$ and $TR_{33}$ are connected in series with one another, this embodiment provides a 3.9V output voltage corresponding to three times the output voltage of the circuit in FIG. 1.

With the constant voltage circuit in FIGS. 1 to 4 as a reference voltage circuit it is possible to design a constant voltage circuit for generating a desired voltage.

FIG. 7 shows another embodiment of this invnetion. In this embodiment, like reference numerals are employed to designate elements corresponding to those shown in the above-mentioned embodiment and further explanation is therefore omitted.

In FIG. 7 the collector of the npn transistor $TR_{33}$ is connected to a current mirror comprising transistors $TR_5$, $TR_6$ etc. This constant voltage circuit is lower in current dissipation then the constant voltage circuit in FIG. 3 additionally including a constant current source comprising the transistor $TR_7$ etc. A constant current source comprising a transistor $TR_{34}$ and resistor $R_{21}$ is used in place of the resistor $R_4$ in the constant voltage circuit in FIG. 1. Since the constant current source can supply a necessary bias current by using a resistor sufficiently lower than the resistor $R_4$ in the constant voltage circuit in FIG. 3, where the constant voltage circuit is embodied as an integrated circuit, it is possible to advantageously reduce a chip size. A diode-coupled transistor $TR_{35}$ is cooperated with the transistors $TR_{33}$, $TR_{31}$ *and* $TR6$ to generate an output voltage corresponding to substantially four times the voltage equivalent to the band gap energy of a semiconductor substrate used. A field effect transistor $TR_{36}$ for drive has a gate connected to ground, and a source and drain respectively connected to the emitter and collector of the transistor $TR_{33}$. Immediately after the power source is turned ON, while a voltage on the output terminal 1 is not increased, the emitter voltage of the transistor $TR_{33}$ is maintained to a low value, the source voltage of the field effect transistor $TR_{36}$ is at a low level and the bias of the transistor $TR_{36}$ is shallow. In consequence, a large current flows through the transistor $TR_{36}$ by way of the transistor $TR_{35}$, resistor $R_1$, transistor $TR_2$ and variable resistor $R_{22}$. After the constant voltage circuit is triggered, a deep bias is applied to the transistor $TR_{36}$ due to an increased emitter voltage of the transistor $TR_{33}$ and an electric current flowing through the transistor $TR_{36}$ is decreased, minimizing the effect exerted by the transistor $TR_{36}$ on the output voltage and improving the variation rate of the output voltage of the constant voltage circuit.

The resistor $R_{22}$ is one used to compensate for the variation of an output voltage resulting from a manufacturing error in the manufacturing processes of integrating the constant voltage circuit. The provision of one extra terminal permits the resistor $R_{22}$ to be adjusted from the outside. Transistors $TR_{37}$ and $TR_{38}$, respectively, serve to increase the input impedancce of transistor $TR_{13}$ and $TR_{15}$, increasing the amplification factor of the transistor $TR_4$. A circuit comprising a resistor $R_{23}$ and transistor $TR_{39}$ allows a relatively small current varied by a temperature variation to be applied to the transistor $TR_{31}$. The constant voltage circuit in FIG. 7 provides a small input-output voltage difference, a small current dissipation and a substantially constant output voltage against the temperature difference.

FIG. 8 shows a constant voltage circuit according to another embodiment of this invention. In this Figure, like reference numerals are employed to designate elements corresponding to those shown in FIG. 7 and further explanation is therefore omitted.

In FIG. 8, transistors $TR_4$ and $TR_{31}$ are driven using as a load a constant current source comprising transistors $TR_{40}$, $TR_{41}$ and $TR_{42}$ and resistors $R_{24}$, $R_{25}$ and $R_{26}$. The transistor $TR_{40}$ is of an npn type and has an emitter connected through the resistor $R_{24}$ to ground, a base connected to the corrector of the transistor $TR_1$ and a collector connected to the collector and base of the npn transistor $TR_{41}$. The transistor $TR_{41}$ has an emitter connected through the resistor 25 to the output terminal, and the collector connected to its own base which is connected to the base of the npn transistor $TR_{42}$. The transistor $TR_{42}$ has a collector connected to the collector of the transistor $TR_4$ and an emitter connected through a resistor $R_{26}$ to the output terminal.

The collector voltage of the transistor $TR_4$ is, after amplified by the transistor $TR_{43}$, supplied to the output terminal 1 through an emitter follower circuit comprising transistors $TR_{13}$, $TR_{14}$ and $TR_{15}$.

In the constant voltage circuit shown in FIG. 8 an electric current determined by the voltage of the output terminal 1 flows through the collectors of the transistors $TR_4$ and $TR_{31}$, and the transistors $TR_4$ and $TR_{31}$ provide a great amplification degree. As a result, there is provided a stable constant voltage circuit involving a small variation of an output voltage with respect to a power supply voltage and reducing the effect of the manufacturing variation of circuit elements to provide a small output variation.

Figure 10:
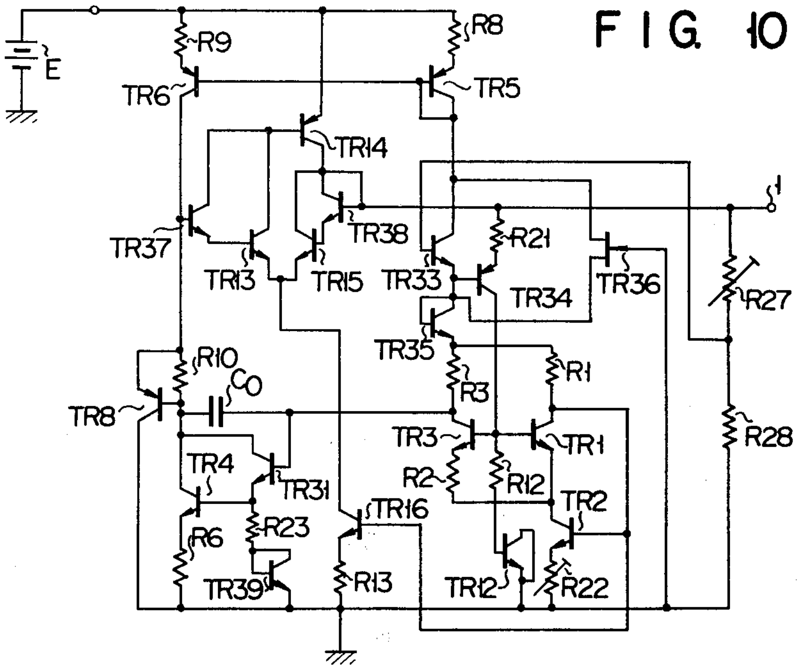
Figure 11:
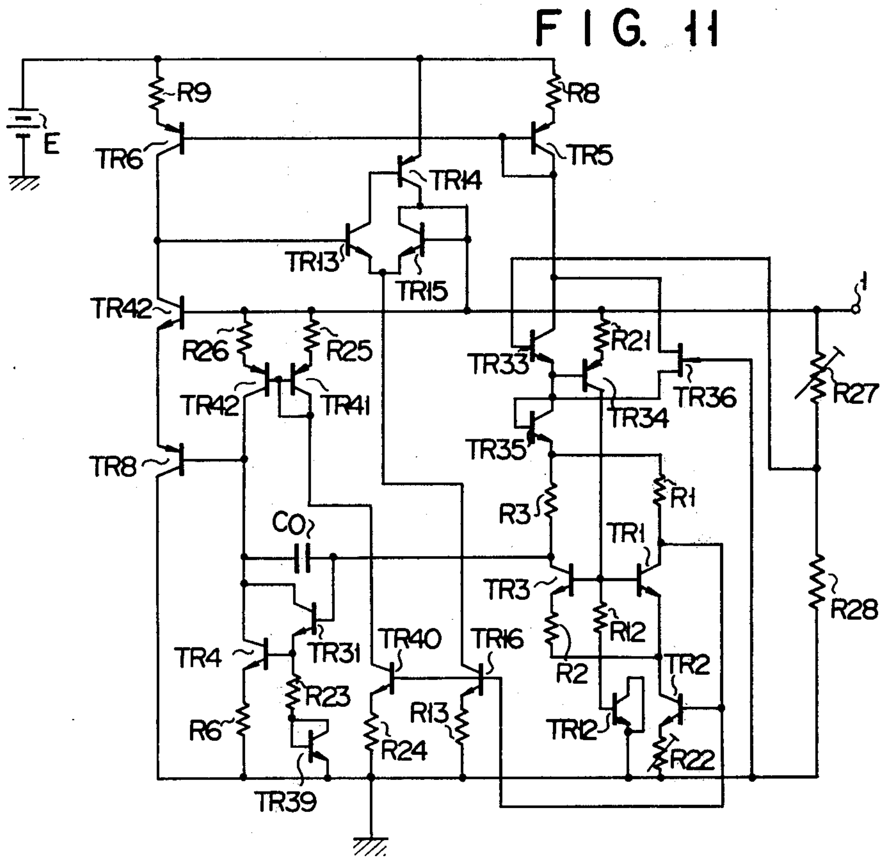

FIGS. 9 to 11 show the modified forms of the embodiments shown in FIGS. 6 to 8, respectively. In the modification shown in FIGS. 9 to 11 the base of a transistor $TR_{33}$ is connected through a variable resistor $R_{27}$ to the output terminal (not connected directly to the output terminal) and through a resistor 28 to ground. An output voltage appearing on the output terminal 1 is controlled by adjusting the resistor $R_{27}$. In the circuit shown in FIG. 9 the base of the transistor $TR_{33}$ may be connected to the collector of the transistor 32, not to the output terminal 1.

What is claimed is:

1. A constant voltage circuit comprising first and second circuit terminals; a first transistor of one conductivity type having a collector coupled to said first circuit terminal; a second transistor of said one conductivity type having a collector and base respectively coupled to the emitter and collector of said first transistor and an emitter coupled to said second circuit terminal; a third transistor of said one conductivity type having a base and emitter respectively coupled to the base and emitter of said first transistor and a collector coupled to said first circuit terminal; a fourth transistor of said one conductivity type having a base coupled to the collector of said third transistor and a collector and emitter respectively coupled to said first and second circuit terminals; and bias means for applying a bias voltage to the bases of said first and third transistors.

2. A constant voltage circuit according to claim 1, in which said bias means comprises a first resistive means connected between said first circuit terminal and a junction between the bases of said first and third transistors and a second resistive means connected between said second circuit terminal and a junction between the bases of said first and third transistors.

3. A constant votlage circuit according to claim 2, further comprising a power supply terminal and a current source connected between said power supply terminal and first circuit terminal.

4. A constant votlage circuit according to claim 2, further comprising a power supply terminal and a current source connected between said power supply terminal and second circuit terminal.

5. A constant voltage circuit according to claim 1, further including a first resistive means connected between the first circuit terminal and the collector of said first transistor, a second resistive means connected between the emitter of said first transistor and the emitter of said third transistor, and a third resistive means connected between said first circuit terminal and the collector of said third transistor.

6. A constant voltage circuit according to claim 5, further including a fourth resistive means connected between second circuit terminal and the emitter of said fourth transistor.

7. A constant voltage circuit according to claim 5 in which said bias means is connected between said first circuit terminal coupled to the collectors of said first and third transistors and said second circuit terminal coupled to the emitters of said second and fourth transistors and has a power supply terminal and a current source the current source being connected between said power supply terminal and first circuit terminal.

8. A constant voltage circuit according to claim 7, further including a capacitor connected between the collector and base of said fourth transistor.

9. A constant voltage circuit according to claim 7, in which said current source comprises a fifth transistor of the other conductivity type having a collector connected to its own base and an emitter coupled to said power supply terminal; a sixth transistor of said other conductivity type having a base connected to the base of said fifth transistor, a collector coupled to the collector of said fourth transistor and an emitter coupled to said power supply terminal; and a seventh transistor of said one conductivity type having a collector connected to the base of said fifth transistor, an emitter coupled to said second circuit terminal and a base connected to the collector of said first transistor.

10. A constant voltage circuit according to claim 9, in which the collector of said sixth transistor is connected through a fourth resistive means to the collector of said fourth transistor and there is further included an eighth transistor of said other conductivity type having an emitter connected to a junction between the collector of said sixth transistor and said fourth resistive means, a base connected to a junction between the collector of said fourth transistor and said fourth resistive means and a collector connected to said second circuit terminal.

11. A constant voltage circuit according to claim 9, further including a starting means connected between the base of the sixth transistor and said second circuit terminal.

12. A constant voltage circuit according to claim 11, in which said starting means comprises a fourth resistive means and a switching element connected in sereis with said fourth resistive means and adapted to be opened and closed in response to electric current flowing through said fourth resistive means.

13. A constant voltage circuit according to claim 12, in which said switching element is a field effect transistor.

14. A constant voltage circuit according to claim 11, further including an eighth transistor of said one conductivity type having a base connected to the collector of said sixth transistor and a collector connected to the power supply terminal, and a ninth transistor of said one conductivity type having a base connected to the emitter of the eighth transistor, a collector connected to the power supply terminal and an emitter connected to the first circuit terminal.

15. A constant voltage circuit according to claim 9, further including an eighth transistor of said one conductivity type having a base connected to the collector of said sixth transistor and a collector connected to the power supply terminal, and a ninth transistor of said one conductivity type having a base connected to the emitter of the eighth transistor, a collector connected to the power supply terminal and an emitter connected to the first circuit terminal.

16. A constant voltage circuit according to claim 15, further including a starting means which is connected between said second circuit terminal and the base of said sixth transistor and which comprises a fourth resistive means and a switching element connected in series with said fourth resistive means and adapted to be rendered on and off in response to a current flowing through said fourth resistive means.

17. A constant voltage circuit according to claim 16, in which said switching element is a field effect transistor.

18. A constant voltage circuit according to claim 9, further including an eighth transistor of the one conductivity type having a base connected to the collector of said sixth transistor; a ninth transistor of said other conductivity type having a base connected to the collector of said eighth transistor, and an emitter connected to said power supply terminal; a tenth transistor of said one conductivity type having a base connected to its own collector and to the collector of said third transistor through the third resistive means and an emitter connected to the emitter of said eighth transistor; and a eleventh transistor of said one conductivity type having a collector connected to a junction between the emitters of said eighth and tenth transistors, a base connected to the base of said seventh transistor and an emitter connected through a fourth resistive means to said second circuit terminal.

19. A constant voltage circuit according to claim 18, further including a starting means connected between the base of said sixth transistor and said second circuit terminal.

20. A constant voltage circuit according to claim 19, in which said starting means comprises a fifth resistive means and a switching element connected in series with said fifth resistive means and adapted to be opened and closed in response to electric current flowing through said fifth resistive means.

21. A constant voltage circuit according to claim 7, in which said bias means comprises a fourth resistive means whose one end is connected to a junction between the bases of said first and third transistors, and a fifth transistor having a base connected to the other end of said fourth resistive means, and an emitter connected to said second circuit terminal.

22. A constant voltage circuit according to claim 7, further including a fifth transistor of said one conductivity type having a base connected to a junction between said current source and the collector of said fourth transistor, a collector connected to said power supply terminal and an emitter connected through the third resistive means to the collector of said third transistor.

23. A constant voltage circuit according to claim 22, further including a sixth transistor of said one conductivity type having an emitter connected to the base of said fourth transistor and to said second circuit terminal through a fourth resistive means, a collector connected to the emitter of said fifth transistor and a base connected to the collector of said third transistor.

24. A constant voltage circuit according to claim 23, further including a seventh transistor of said one conductivity type having a base and collector connected to the emitter of said fifth transistor and an emitter connected through the third resistive means to the collector of said third transistor.

25. A constant voltage circuit according to claim 23, further including a seventh transistor of said one conductivity type having an emitter connected through the first resistive means to the collector of said first transistor, a collector connected to the first circuit terminal, and a base connected to said first circuit terminal through a variable resistor and to the second circuit terminal through a resistive means.

26. A constant voltage circuit according to claim 23, further including a seventh transistor of said one conductivity type having an emitter connected through the first resistive means to the collector of said first transistor, a collector connected to the collector of said fifth transistor, and a base connected to said first circuit terminal through a variable resistor and to said second circuit terminal through a resistive means.

27. A constant voltage circuit according to claim 23, further including a capacitor connected between the collector of said fourth transistor and the base of said sixth transistor.

28. A constant voltage circuit according to claim 7, in which said current source comprises a fifth transistor of the other conductivity type having an emitter connected through a fourth resistive means to said power supply terminal and a collector connected to its own base; a sixth transistor of said other conductivity type having a base connected to the base of said fifth transistor, a collector connected to the collector of said fourth transistor and an emitter connected through a fifth resistive means to said power supply terminal; a seventh transistor of said one conductivity type having a collector connected to the collector of said fifth transistor; and an eighth transistor of said one conductivity type having a base connected to its own collector and to the collector of said seventh transistor and an emitter connected through the first resistive means to the collector of said first transistor and in which there are further included a field effect transistor having a drain and source respectively connected to the collector and emitter of said seventh transistor and a gate connected to said second circuit terminal; a ninth transistor of said one conductivity type having a base connected to the collector of said sixth transistor; a tenth transistor of said other conductivity type having a base connected to the collector of said ninth transistor and an emitter connected to said power supply terminal; an eleventh transistor of said one conductivity type having a base connected to its own collector and base of said seventh transistor and an emitter connected to the emitter of said ninth transistor; and a twelfth transistor of said one conductivity type having a base connected to the base of said second transistor, a collector connected to a junction between the emitters of said ninth and eleventh transistors, and an emitter connected through a sixth resistive means to said second circuit terminal.

29. A constant voltage circuit according to claim 28, further including a variable resistor connected between said first circuit terminal and the base of said seventh transistor, and a resistive means connected between said second circuit terminal and the base of said seventh transistor.

30. A constant voltage circuit according to claim 28, in which the collector of said sixth transistor is connected through a seventh resistive means to the collector of said fourth transistor and which further includes thirteenth transistor of said other conductivity type having an emitter connected to a junction between said seventh resistive means and the collector of said sixth transistor, a base connected to a junction between said seventh resistive means and the collector of said fourth transistor, and a collector connected to the second circuit terminal.

31. A constant voltage circuit according to claim 28, further including a thirteenth transistor of said one conductivity type having an emitter connected to the base of said fourth transistor and to said second circuit terminal through a seventh resistive means, a collector connected to the collector of said fourth transistor and a base connected to the collector of said third transistor.

32. A constant voltage circuit according to claim 31, in which said seventh resistive means includes a fourteenth transistor of said one conductivity type having a base and collector connected through a resistive means to the emitter of said thirteenth transistor and an emitter connected to said second circuit terminal.

33. A constant voltage circuit according to claim 28, further including a thirteenth transistor of said one conductivity type having a collector connected to the collector of said sixth transistor and a base connected to the base of said eleventh transistor; a fourteenth transistor of said other conductivity type having an emitter connected through a seventh resistive means to the base of said thirteenth transistor and a collector connected to the collector of said fourth transistor; a fifteenth transistor of said other conductivity type having an emitter connected through a eighth resistive means to the base of said thirteenth transistor and a base connected to its own collector and base of said fourteenth transistor; and a sixteenth transistor of said one conductivity type having a collector connected to the collector of said fifteenth transistor, a base connected to the base of said twelfth transistor and an emitter connected through a resistive means to said second circuit terminal; and a seventeenth transistor of said other conductivity type having an emitter connected to the emitter of said thirteenth transistor, a collector connected to said second circuit terminal and a base connected to the collector of said fourth transistor.

34. A constant voltage circuit according to claim 7 in which said current source comprises fifth to eighth transistors of the other conductivity type the emitters of which are connected respectively through fourth to seventh resistive means to said first circuit terminal and the bases of which are connected in common with each other, the collector and base of said fifth transistor being connected to each other, the collector of said fifth transistor being connected to said second circuit terminal and the collector of said sixth transistor being connected to the collector of said fourth transistor, and in which there are further included a ninth transistor of said one conductivity type having a collector connected to said first circuit terminal and a base connected to the collector of said third transistor; a tenth transistor of said one conductivity type having a collector connected to the emitter of said ninth transistor, a base connected to the collector of said first transistor and an emitter coupled to the emitter of said second transistor; an eleventh transistor of said other conductivity type having a base connected to the emitter of said ninth transistor and a collector connected to the emitter of said second transistor; a twelfth transistor of said other conductivity type having a base connected to the emitter of the eleventh transistor and an emitter connected to said first circuit terminal; a thirteenth transistor of said one conductivity type having a base connected to the collector of said twelfth transistor and a collector connected to said first circuit terminal; a fourteenth transistor of said one conductivity type having a collector connected to the emitter of said thirteenth transistor and an emitter connected to said power supply terminal; a fifteenth transistor of said one conductivity type having a collector connected to its own base and collector of said eighth transistor and an emitter coupled to said power supply terminal; a sixteenth transistor of said other conductivity type having a base connected to the collector of said fourteenth transistor; a seventeenth transistor of said one conductivity type having a collector connected to its own base, emitter of said sixteenth transistor and collector of said seventh transistor; an eighteenth transistor of said one conductivity type having a collector connected to the emitter of said seventeenth transistor, a base connected to the collector of said fifteenth transistor and an emitter connected to said power supply terminal; and an eighth resistive means and switching element connected between said power supply terminal and the bases of said fifth to eighth transistors, said switching element being adapted to be opened and closed in response to electric current flowing through said eighth resistive means.

35. A constant voltage circuit according to claim 1, further comprising a power supply terminal and a current source, the current source being connected between said power supply terminal and first circuit terminal.

36. A constant voltage circuit according to claim 1, further comprising a power supply terminal and a current source, the current source being connected between said power supply terminal and second circuit terminal.

37. A constant voltage circuit according to claim 1, further including a first resistive means connected between said second circuit terminal and the emitter of said fourth transistor.

* * * * *